(12) United States Patent
Jung et al.

(10) Patent No.: US 12,225,810 B2
(45) Date of Patent: Feb. 11, 2025

(54) DISPLAY DEVICE AND METHOD FOR MANUFACTURING THE SAME

(71) Applicant: Samsung Display Co., Ltd., Yongin-si (KR)

(72) Inventors: Suk Won Jung, Hwaseong-si (KR); Seokhyun Nam, Seoul (KR); Jongdeok Park, Hwaseong-si (KR); Cheuljin Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 781 days.

(21) Appl. No.: 17/261,385

(22) PCT Filed: Apr. 29, 2019

(86) PCT No.: PCT/KR2019/005165
§ 371 (c)(1),
(2) Date: Jan. 19, 2021

(87) PCT Pub. No.: WO2020/017744
PCT Pub. Date: Jan. 23, 2020

(65) Prior Publication Data
US 2021/0265580 A1    Aug. 26, 2021

(30) Foreign Application Priority Data

Jul. 20, 2018    (KR) .......................... 10-2018-0084935

(51) Int. Cl.
*H10K 77/10* (2023.01)
*H10K 50/84* (2023.01)
(Continued)

(52) U.S. Cl.
CPC ......... *H10K 77/111* (2023.02); *H10K 50/841* (2023.02); *H10K 50/844* (2023.02);
(Continued)

(58) Field of Classification Search
CPC .. H10K 77/111; H10K 50/841; H10K 50/844; H10K 50/80; H10K 59/12;
(Continued)

(56) References Cited

U.S. PATENT DOCUMENTS 6,091,195 A * 7/2000 Forrest ................. H10K 50/856
313/506
7,078,726 B2    7/2006 Pichler et al.
(Continued)

FOREIGN PATENT DOCUMENTS

CN    103915480 A    7/2014
CN    104471630 A    3/2015
(Continued)

OTHER PUBLICATIONS

Prophotonix, "What Wavelength is used for UV curing?" Accessed Nov. 4, 2023. Not Prior Art. (Year: 2023).*
(Continued)

*Primary Examiner* — Alex B Efta
*Assistant Examiner* — Alexander S Wright
(74) *Attorney, Agent, or Firm* — Lewis Roca Rothgerber & Christie LLP

(57) ABSTRACT

A display device includes: a display module including: a display panel including a first display surface having a first side and a second side opposite the first side, a second display surface extending from the first side at an angle with respect to the first display surface, and a third display surface extending from the second side at an angle with respect to the first display surface; and an input sensing circuit on the display panel; a first adhesive member on the first display surface, the second display surface, and the third display surface, the first adhesive member including an acrylic-based material; a second adhesive member on the first adhesive member, and including at least one of a polyure-
(Continued)

thane-based material, a polyethersulfone-based material, a polyamide-based material, or an ethylene-vinyl acetate-based material; and a window member on the second adhesive member.

11 Claims, 19 Drawing Sheets

(51) Int. Cl.
    *H10K 50/844*     (2023.01)
    *H10K 59/12*     (2023.01)
    *H10K 59/40*     (2023.01)
    *H10K 71/00*     (2023.01)
    *H10K 102/00*     (2023.01)

(52) U.S. Cl.
    CPC .............. *H10K 59/12* (2023.02); *H10K 59/40* (2023.02); *H10K 71/00* (2023.02); *B32B 2457/206* (2013.01); *H10K 2102/311* (2023.02)

(58) Field of Classification Search
    CPC ........ H10K 59/40; H10K 59/00; H10K 71/00; H10K 71/50; H10K 2102/311; B32B 2457/206; Y02E 10/549; Y02P 70/50
    See application file for complete search history.

(56) References Cited

U.S. PATENT DOCUMENTS

| | | |
|---|---|---|
| 8,508,701 B2 | 8/2013 | Nakagawa et al. |
| 9,303,840 B2 | 4/2016 | Cho |
| 9,498,938 B2 | 11/2016 | Son et al. |
| 10,310,333 B2 | 6/2019 | Yasui et al. |
| 10,347,700 B2 | 7/2019 | Yang et al. |
| 10,586,941 B2 | 3/2020 | Lee et al. |
| 10,987,896 B2 | 4/2021 | Lee et al. |
| 2006/0132461 A1* | 6/2006 | Furukawa .............. H10K 71/80 345/173 |
| 2013/0285681 A1 | 10/2013 | Wilson et al. |
| 2014/0118902 A1 | 5/2014 | Kim |
| 2014/0262002 A1* | 9/2014 | Suwa .......................... C09J 7/29 156/60 |
| 2017/0156227 A1 | 6/2017 | Heo et al. |
| 2017/0200915 A1* | 7/2017 | Lee ........................ H10K 59/40 |
| 2018/0371196 A1 | 12/2018 | Park et al. |

FOREIGN PATENT DOCUMENTS

| | | |
|---|---|---|
| CN | 106548712 A | 3/2017 |
| CN | 106816098 A | 6/2017 |
| CN | 106960849 A | 7/2017 |
| JP | 5535739 B2 | 7/2014 |
| KR | 10-2014-0052732 A | 5/2014 |
| KR | 10-2015-0038449 A | 4/2015 |
| KR | 20150038449 * | 4/2015 |
| KR | 10-2015-0134848 A | 12/2015 |
| KR | 10-2016-0013445 A | 2/2016 |
| KR | 10-1588600 B1 | 2/2016 |
| KR | 10-2016-0050815 A | 5/2016 |
| KR | 20160050815 * | 5/2016 |
| KR | 10-2016-0128379 A | 11/2016 |
| KR | 10-1701247 B1 | 2/2017 |
| KR | 10-1706617 B1 | 2/2017 |
| KR | 10-2017-0068823 A | 6/2017 |
| KR | 10-2017-0084402 A | 7/2017 |
| KR | 10-2017-0113822 A | 10/2017 |
| KR | 10-2018-0018503 A | 2/2018 |

OTHER PUBLICATIONS

International Search Report dated Aug. 8, 2019, for corresponding Application No. PCT/KR2019/005165, mailed Aug. 8, 2019, 3 pages.

* cited by examiner

FIG. 1
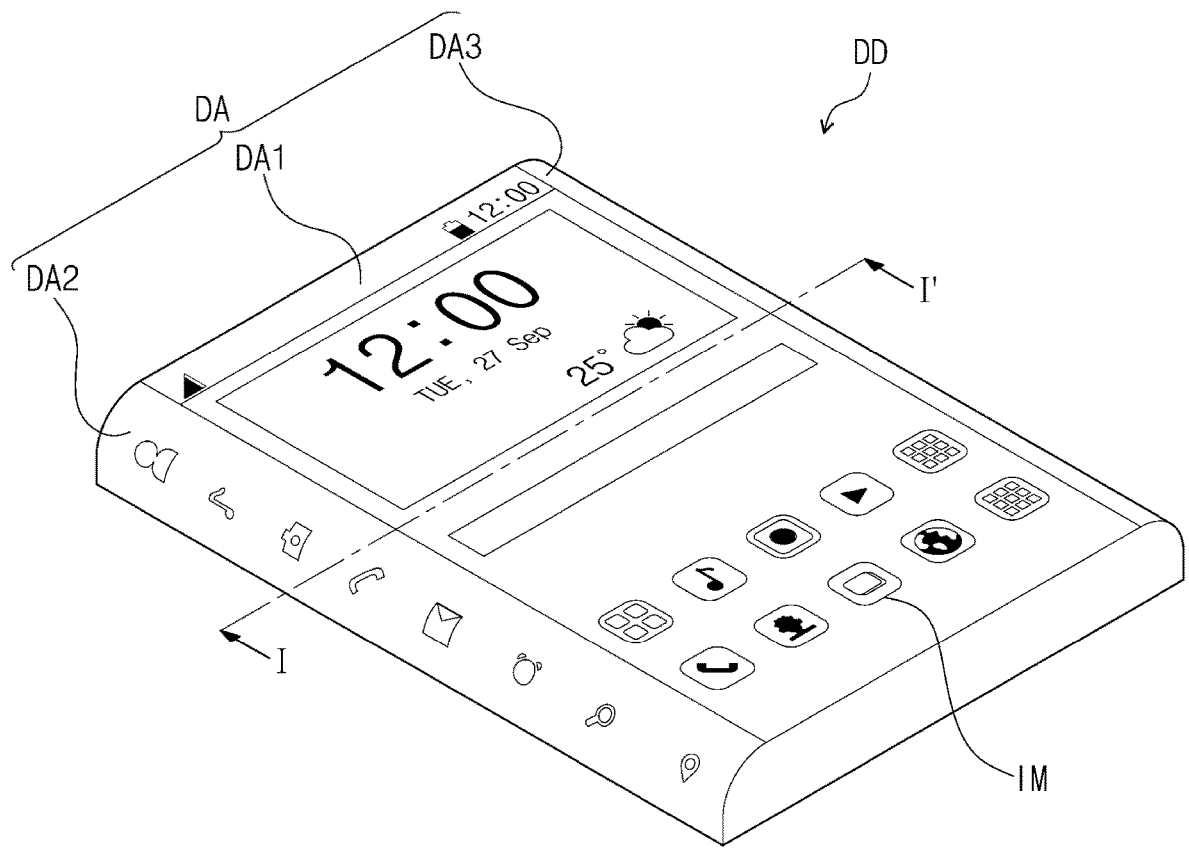
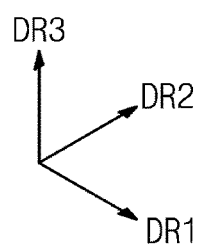

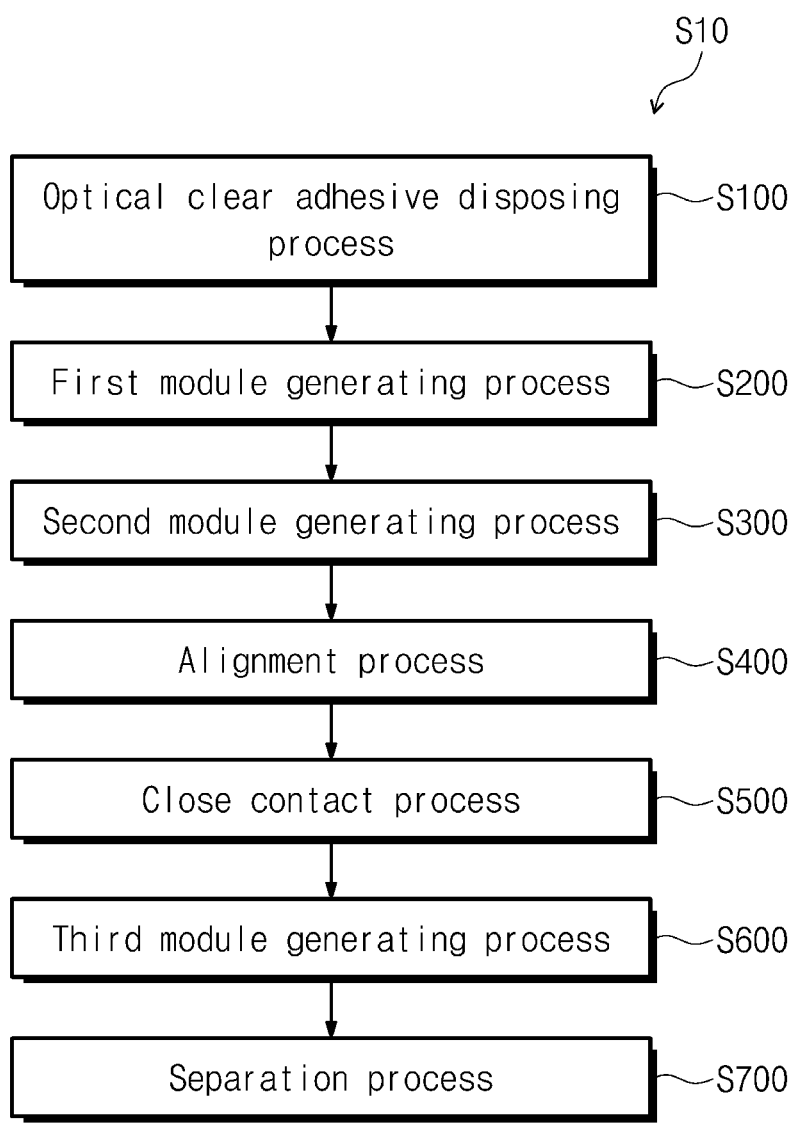

FIG. 13E
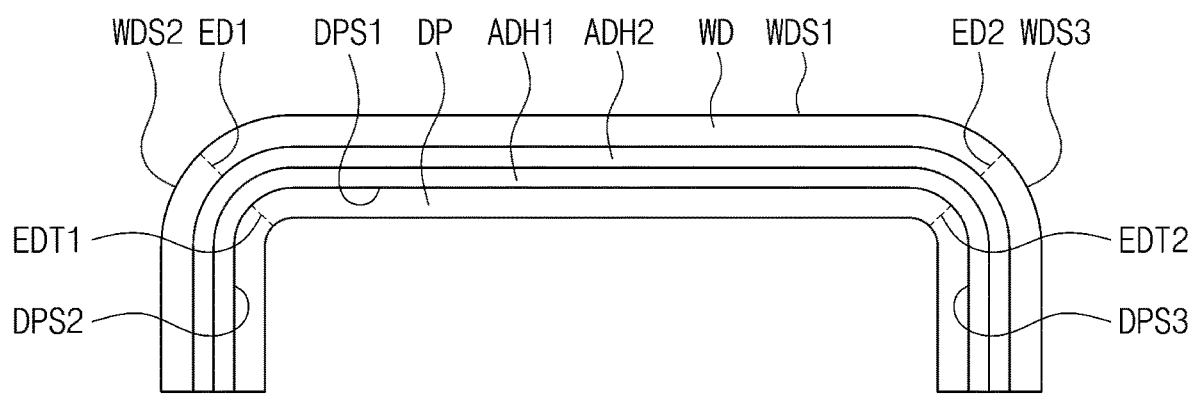
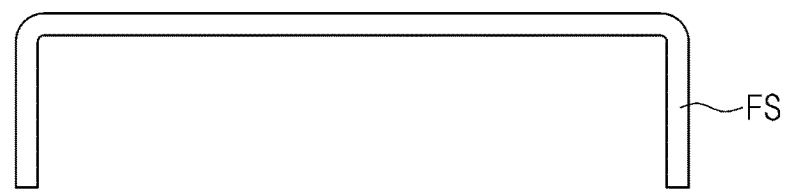
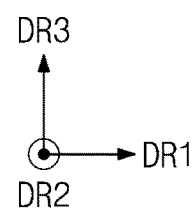

DISPLAY DEVICE AND METHOD FOR MANUFACTURING THE SAME

CROSS-REFERENCE TO RELATED APPLICATIONS

This application is a U.S. National Phase Patent Application of International Application No. PCT/KR2019/005165, filed on Apr. 29, 2019, which claims priority to Korean Patent Application No. 10-2018-0084935, filed on Jul. 20, 2018, the entire content of all of which is hereby incorporated by reference.

BACKGROUND

1. Field

Aspects of example embodiments of the present disclosure relate to a display device and a manufacturing method thereof, and more particularly, to a method for attaching a window member and a display module to each other.

2. Description of the Related Art

Various display devices used in multimedia devices, for example, such as televisions, mobile phones, tablet computers, navigation units, game consoles, and the like, have been developed.

In recent years, a flexible display device has been developed to be applied to various shaped devices, and a window member having at least one bent portion has been developed.

In a process of manufacturing a display device by using the bent window member, as a stress is applied to a portion (e.g., to one portion) of a display module disposed below the window member, a crack may occur.

The above information disclosed in this Background section is for enhancement of understanding of the background of the present disclosure, and therefore, it may contain information that does not constitute prior art.

SUMMARY

One or more example embodiments of the present disclosure are directed to a display device having a structure capable of preventing or substantially prevented a crack from being generated in a portion (e.g., in one portion) of a display module during a manufacturing process thereof, and a method for manufacturing the same.

According to one or more example embodiments of the present disclosure, a display device includes: a display module including: a display panel including a first display surface having a first side and a second side opposite the first side, a second display surface extending from the first side at an angle with respect to the first display surface, and a third display surface extending from the second side at an angle with respect to the first display surface; and an input sensing circuit on the display panel; a first adhesive member on the first display surface, the second display surface, and the third display surface, the first adhesive member including an acrylic-based material; a second adhesive member on the first adhesive member, and including at least one of a polyurethane-based material, a polyethersulfone-based material, a polyimide-based material, or an ethylene-vinyl acetate-based material; and a window member on the second adhesive member.

In an example embodiment, the second adhesive member may be directly on the first adhesive member.

In an example embodiment, the window member may include: a first transmission surface that overlaps with the first display surface; a second transmission surface that overlaps with the second display surface to form an angle with the first transmission surface; and a third transmission surface that overlaps with the third display surface to form an angle with the first transmission surface.

In an example embodiment, the angle between the first display surface and the second display surface may be greater than or equal to 90° and less than or equal to 180°, and the angle between the first display surface and the third display surface may be greater than or equal to 90° and less than or equal to 180°.

In an example embodiment, the first display surface may further include: a third side forming an angle with each of the first side and the second side; and a fourth side opposite the third side. The display panel may further include: a fourth display surface extending from the third side at an angle with respect to the first display surface; and a fifth display surface extending from the fourth side at an angle with respect to the first display surface.

In an example embodiment, at least a portion of each of the second to fifth display surfaces may have a curvature.

In an example embodiment, the first display surface may have a convex curved shape.

In an example embodiment, the display panel may include an organic light emitting element.

In an example embodiment, the display panel may include: a base film; a circuit layer on the base film; an organic light emitting element layer on the circuit layer; and a thin-film encapsulation layer configured to seal the organic light emitting element layer, and the input sensing circuit may be directly on the thin-film encapsulation layer.

According to one or more example embodiments of the present disclosure, a method for manufacturing a display device, includes: disposing an optical clear adhesive (OCA) including an acrylic-based material on a display module, the display module including a flexible display panel, and an input sensing circuit on the flexible display panel; generating a first module by disposing a hot-melt adhesive on the optical clear adhesive, the hot-melt adhesive including at least one of a polyurethane-based material, a polyethersulfone-based material, a polyamide-based material, or an ethylene-vinyl acetate-based material; generating a second module by disposing the first module on a fixing sheet; aligning a window member on the second module, the window member including a first transmission surface having a first side and a second side opposite the first side, a second transmission surface extending from the first side at an angle with respect to the first transmission surface, and a third transmission surface extending from the second side at an angle with respect to the first transmission surface; contacting the second module and the window member to each other; generating a third module by coupling the second module and the window member to each other by applying heat to the second module and the window member for a time; and separating the fixing sheet from the third module.

In an example embodiment, at least a portion of each of the second transmission surface and the third transmission surface may have a curvature.

In an example embodiment, the angle between the first transmission surface and the second transmission surface may be greater than or equal to 90° and less than or equal to 180°, and the angle between the first transmission surface and the third transmission surface may be greater than or equal to 90° and less than or equal to 180°.

In an example embodiment, the first transmission surface may further include: a third side configured to form an angle with each of the first side and the second side; and a fourth side opposite the third side; and the window member may further include: a fourth transmission surface extending from the third side at an angle with respect to the first transmission surface; and a fifth transmission surface extending from the fourth side at an angle with respect to the first transmission surface.

In an example embodiment, the first transmission surface may have a convex curved shape.

In an example embodiment, the heat may be greater than or equal to 70° and less than or equal to 100°, and the time may be greater than or equal to 15 minutes and less than or equal to 25 minutes.

In an example embodiment, the aligning of the window member on the second module may include disposing the second module on a pressure applying device including a stretchable membrane and a pneumatic pressure supplying device; and the contacting of the second module and the window member to each other may include applying a pneumatic pressure to the stretchable membrane by the pneumatic pressure supplying device to allow the second module and the window member to closely contact each other.

In an example embodiment, the fixing sheet may include: a protection film; and a non-cured ultraviolet curing resin that may be disposed on one surface of the protection film in the generating of the second module, and the separating of the fixing sheet from the third module may include curing the non-cured ultraviolet curing resin by supplying UV light to the fixing sheet.

In an example embodiment, the UV light may have a wavelength greater than or equal to 330 nm and less than or equal to 390 nm.

In an example embodiment, the display panel may include an organic light emitting element.

In an example embodiment, the display panel may include: a base film; a circuit layer on the base film; an organic light emitting element layer on the circuit layer; and a thin-film encapsulation layer configured to seal the organic light emitting element layer, and the input sensing circuit may be directly on the thin-film encapsulation layer.

According to one or more example embodiments of the present disclosure, a display device having a structure capable of preventing or substantially preventing a crack from being generated in a manufacturing process thereof, and a method for manufacturing the display device capable of preventing or substantially preventing the crack from being generated may be provided.

BRIEF DESCRIPTION OF THE DRAWINGS

The above and other aspects and features of the present disclosure will become more apparent to those skilled in the art from the following detailed description of the example embodiments with reference to the accompanying drawings.

FIG. 1 is a perspective view of a display device according to an embodiment of the present disclosure.

FIG. 9 is a flowchart representing a method for manufacturing the display device according to an embodiment of the present disclosure.

FIGS. 13D-13E are views illustrating a separation process of FIG. 9.

DETAILED DESCRIPTION

Figure 2:
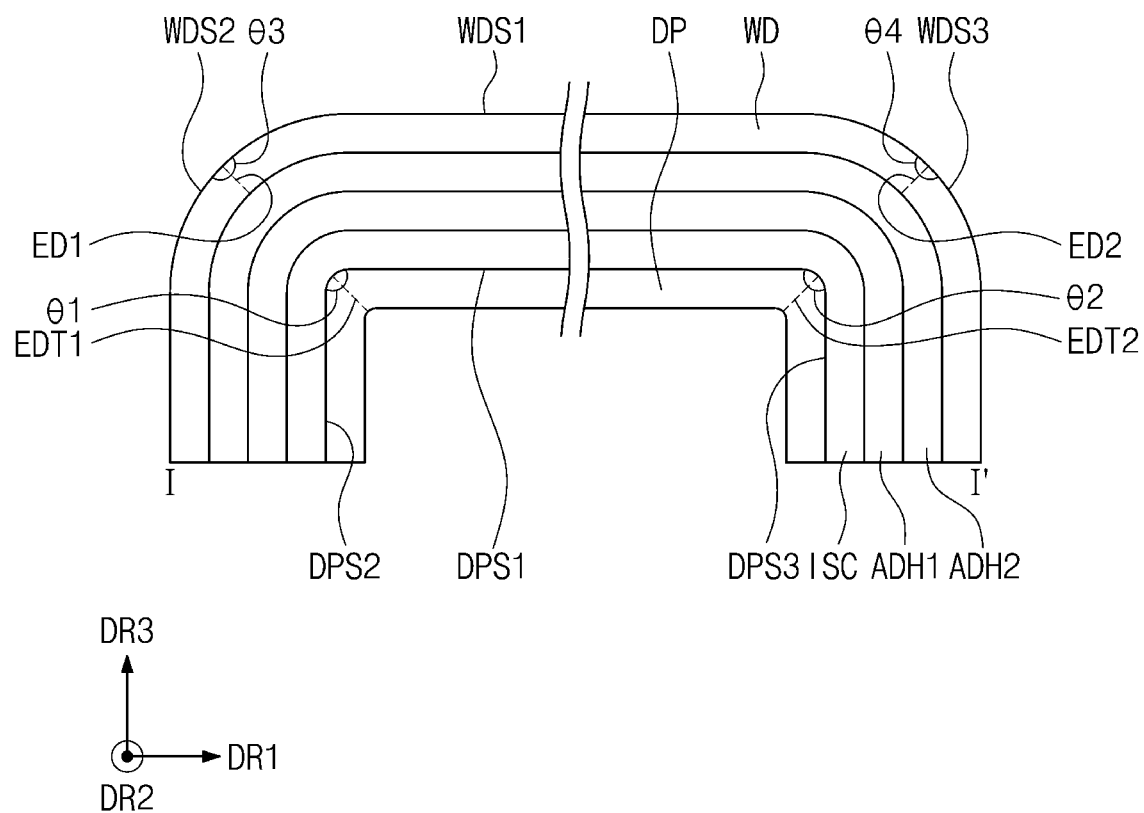
FIG. 2 is a view illustrating a portion of a cross-section taken along the line of FIG. 1.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. Thus, these terms as used herein may be a relative concept, and may be described based on directions shown in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As shown in the figures, a front surface (or a top surface) and a rear surface (or a bottom surface) of each element, member, layer, and/or the like is distinguished by a third directional axis DR3. However, the first to third directional axes DR1, DR2, and DR3 are illustrated in the figures as an example. Thus, the directions indicated by the first to third directional axes DR1, DR2, and DR3 may be relative concepts, and may be converted with respect to each other. As used herein, the first to third directions may be directions indicated by the first to third directional axes DR1, DR2, and DR3, and thus, may be designated by the same reference numerals, respectively.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "contains," "containing," "has," "have," and "having," when used in this specification, specify the presence of the stated properties, numbers, features, integers, steps, operations, elements, and/or components, but do not preclude the presence or addition of one or more other properties, numbers, features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device DD according to an embodiment of the present disclosure.

Although the display device DD having a curved display surface is illustrated in FIG. 1 as an example embodiment of the present disclosure, the present disclosure is not limited thereto. For example, in other embodiments, the display device DD may include a flat or substantially flat display surface, or a three-dimensional display surface. The three-dimensional display surface may include a plurality of display areas indicating (e.g., facing) different directions from each other, and may further include, for example, a polygonal column type of display surface.

The display device DD according to the embodiment of FIG. 1 may be a flexible display device. However, the present disclosure is not limited thereto. For example, the display device DD according to other embodiments of the present disclosure may be a rigid display device DD. The display device DD according to one or more embodiments of the present disclosure may be used for large-sized electronic devices, for example, such as televisions and monitors, and small and medium-sized electronic devices, for example, such as mobile phones, tablet computers, navigation units (e.g., navigation devices) for vehicles, game consoles, and smart watches.

A display area DA may be defined in the display device DD. The display area DA is defined as an area for displaying an image IM.

The display area DA includes a first display area DA1 for displaying the image IM through a front surface, and second and third display areas DA2 and DA3 each for displaying the image IM through a corresponding side surface. FIG. 1 illustrates icon images IM as an example of the image IM.

FIG. 2 is a cross-sectional view of the display device DD according to an embodiment of the present disclosure.

FIG. 2 is a cross-sectional view of the display device DD taken along the line I-I' of FIG. 1, and shows a laminated relationship between a functional panel and/or functional units (e.g., functional circuits, devices, members, or layers) of the display device DD.

The display device DD according to an embodiment of present disclosure may include a display panel DP, an input sensing circuit ISC, a first adhesive member (e.g., a first adhesive layer) ADH1, a second adhesive member (e.g., a second adhesive layer) ADH2, and a window member (e.g., a window layer) WD.

Referring to FIG. 2, the display panel DP may include first to third display surfaces DPS1 to DPS3. For example, the first to third display areas DA1 to DA3 in FIG. 1 may correspond to the first to third display surfaces DPS1 to DPS3 in FIG. 2, respectively.

The first display surface DPS1 may include a first side EDT1, and a second side EDT2 opposite to (e.g., facing away from) the first side EDT1.

The second display surface DPS2 may extend from the first side EDT1, and may provide a suitable angle (e.g., a predetermined angle) with respect to the first display surface DPS1.

The third display surface DPS3 may extend from the second side EDT2, and may provide a suitable angle (e.g., a predetermined angle) with respect to the first display surface DPS1.

At least a portion of each of the second display surface DPS2 and the third display surface DPS3 may have a suitable curvature (e.g., a predetermined curvature).

An angle (e.g., a predetermined angle) (θ1) provided between the first display surface DPS1 and the second display surface DPS2, and/or an angle (e.g., a predetermined angle) (θ2) provided between the first display surface DPS1 and the third display surface DPS3 may be greater than or equal to about 90° and less than or equal to about 180°. When the angle (e.g., θ1 and/or θ2) is less than about 90°, an excessive amount of stress may be applied to cause damage. When the angle (e.g., θ1 and/or θ2) is greater than about 180°, a desired bent shape, for example, as shown in FIG. 2, may not be implemented. The display panel DP according to an embodiment of present disclosure generates the image IM. For example, the display panel DP may be an organic light emitting display panel or a quantum-dot light emitting display panel. The organic light emitting display panel may include a light emitting layer containing an organic light emitting material. The quantum dot light emitting display panel may include a light emitting layer containing a quantum dot, a quantum rod, and/or the like. However, the present disclosure is not limited thereto. For example, the display panel DP may be an electrophoretic display panel, a plasma display panel, a liquid crystal display panel, and/or the like. Hereinafter, for convenience, the display panel DP will be described in more detail as the organic light emitting display panel as a non-limiting example.

The input sensing circuit ISC may be disposed on the display panel DP. For example, when the display panel DP includes a thin-film encapsulation layer TFE (e.g., refer to FIG. 4), the input sensing circuit ISC may be directly disposed on the thin-film encapsulation layer TFE.

As used in this specification, an expression "B component is directly disposed on A component" represents that an additional adhesive layer or member is not disposed between the A component and the B component. In other words, the expression "directly disposed" may represent that the corresponding components "contact" each other.

The input sensing circuit ISC according to an embodiment of the present disclosure may sense a variation in capacitance caused by an external object to thereby sense an external input. In this case, the input sensing circuit ISC may be referred to as a capacitive input sensing circuit.

However, the present disclosure is not limited thereto, and the input sensing circuit ISC according to another embodiment of the present disclosure may sense a variation in pressure caused by an external object to thereby sense an external input. In this case, the input sensing circuit ISC may be referred to as a pressure sensitive input sensing circuit.

The first adhesive member ADH1 may be disposed on the input sensing circuit ISC. At least some of the components constituting the display device DD may be connected to each other through the first adhesive member ADH1. The first adhesive member ADH1 may be an optical clear adhesive (OCA) containing an acrylic-based material.

The second adhesive member ADH2 may be disposed on the first adhesive member ADH1. At least some of the components constituting the display device DD may be connected to each other through the second adhesive member ADH2. The second adhesive member ADH2 may be directly disposed on the first adhesive member ADH1.

The second adhesive member ADH2 may be a hot-melt optical clear adhesive (Hot-Melt OCA) containing at least one of a polyurethane-based material, a polyethersulfone-based material, a polyimide-based material, and/or an ethylene-vinyl acetate-based material. For example, the second adhesive member ADH2 may be an EVA hot-melt optical clear adhesive (Hot-Melt OCA) containing an ethylene-vinyl acetate-based material.

The window member WD may be disposed on the second adhesive member ADH2. The window member WD may include a first transmission surface WDS1, a second transmission surface WDS2, and a third transmission surface WDS3.

The first transmission surface WDS1 may include a first transmission side ED1, and a second transmission side ED2 opposite to (e.g., facing away from) the first transmission side ED1.

The second transmission surface WDS2 may extend from the first transmission side ED1, and may provide a suitable angle (e.g., a predetermined angle) with respect to the first transmission surface WDS1.

The third transmission surface WDS3 may extend from the second transmission side ED2, and may provide a suitable angle (e.g., a predetermined angle) with respect to the first transmission surface WDS1.

At least a portion of each of the second transmission surface WDS2 and the third transmission surface WDS3 may have a suitable curvature (e.g., a predetermined curvature).

An angle (e.g., a predetermined angle) (θ3) provided between the first transmission surface WDS1 and the second transmission surface WDS2, and/or an angle (e.g., a predetermined angle) (θ4) provided between the first transmission surface WDS1 and the third transmission surface WDS3 may be greater than or equal to about 90° and less than or equal to about 180°.

The window member WD may protect a display module DM (e.g., corresponding to the display panel DP and the input sensing circuit ISC) from an external impact, and may provide an input surface to a user. The window member WD may include glass or plastic. The window member WD may have a transparent property so that light generated from the display panel DP is transmitted therethrough.

Figure 3:
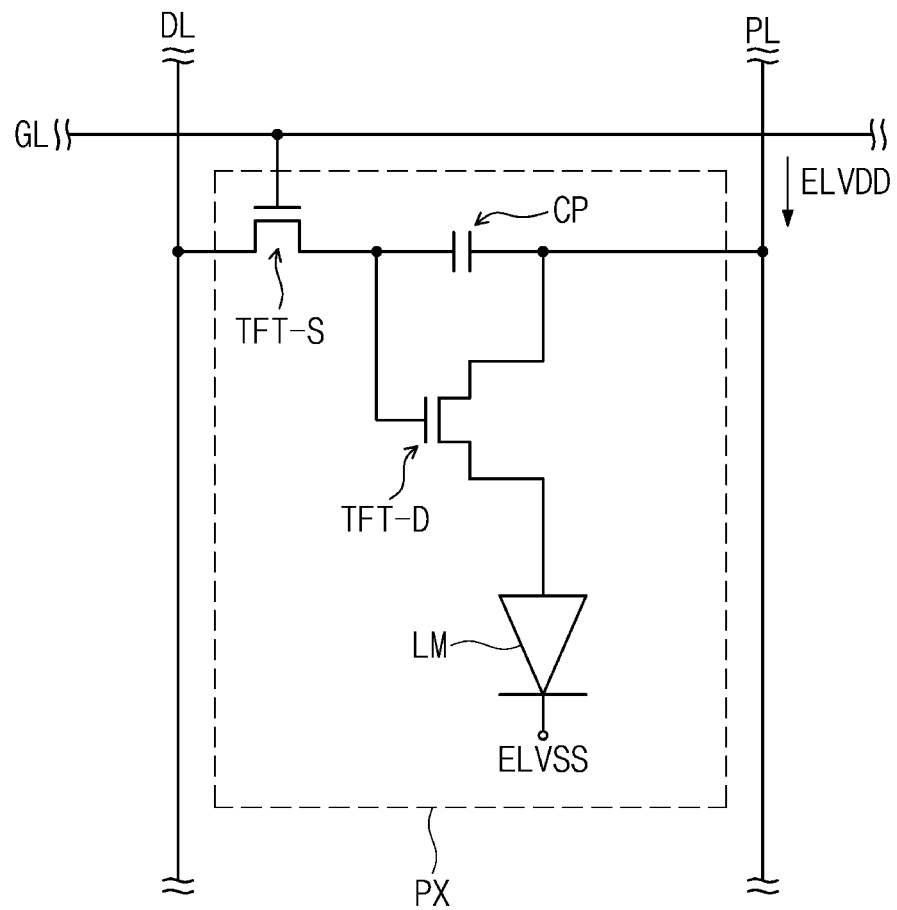
FIG. 3 is an equivalent circuit diagram of a pixel according to an embodiment of the present disclosure.
Figure 4:
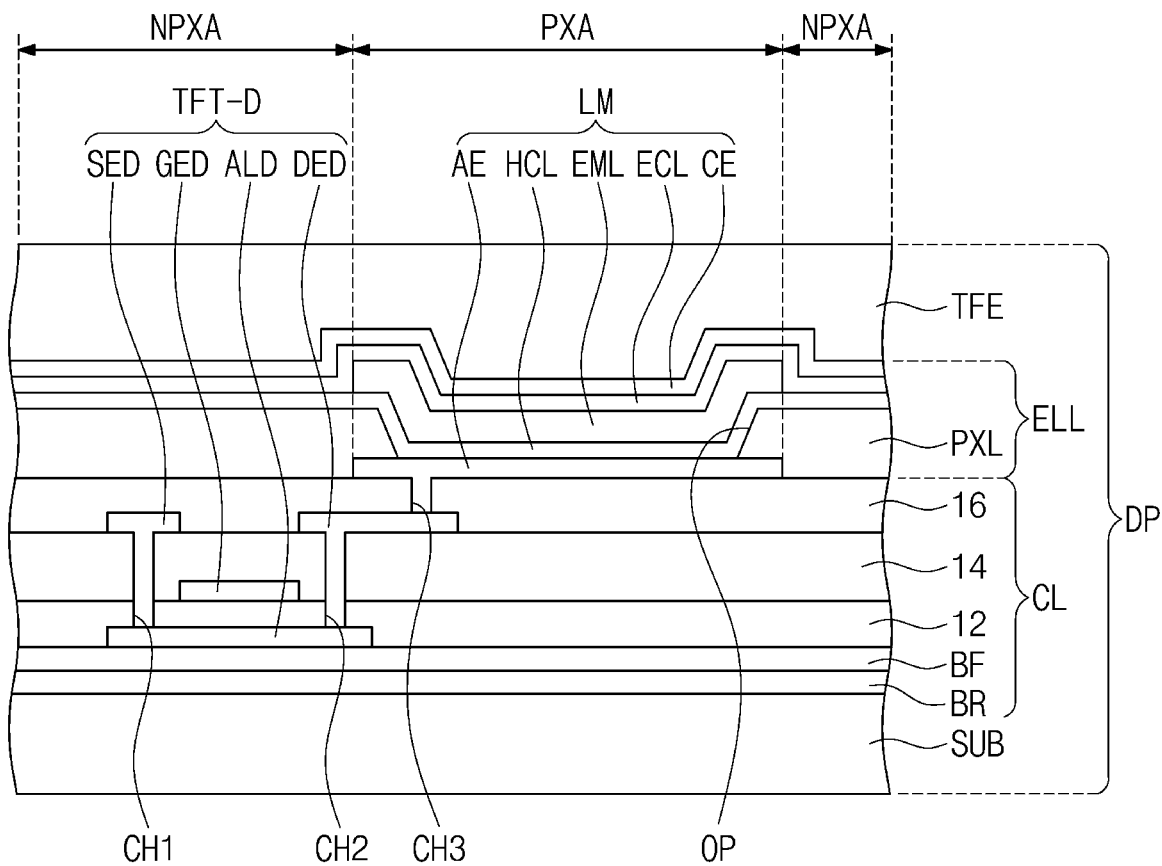
FIG. 4 is a view illustrating a portion of a cross-section of the pixel according to an embodiment of the present disclosure.

FIG. 3 is an equivalent circuit diagram of a pixel PX according to an embodiment of the present disclosure. FIG. 4 is a cross-sectional view of a portion of the pixel PX according to an embodiment of the present disclosure. For example, FIG. 4 illustrates a cross-section of a portion of the pixel PX corresponding to a driving transistor TFT-D and a light emitting element LM of the equivalent circuit in FIG. 3.

The display panel DP may include a gate line GL, a data line DL, and a plurality of pixels PX connected to a power line PL.

FIG. 3 is a view illustrating an example of the pixel PX connected to each of one gate line GL, one data line DL, and the power line PL. However, the present disclosure is not limited to the constitution (e.g., the configuration and/or circuit structure) of the pixel PX shown in FIG. 3. For example, the pixel PX may be variously modified, for example, such that the pixel PX may include more than two transistors and/or more than one capacitor.

The pixel PX includes a light emitting element LM as a display element. For example, the light emitting element LM may be a front emitting diode or a rear emitting diode. As another example, the light emitting element LM may be a dual emitting diode. In some embodiments, the light emitting element LM may be an organic light emitting diode. A circuit (e.g., a pixel circuit or a circuit part) of the pixel PX for driving the light emitting element LM may include a switching transistor TFT-S, a driving transistor TFT-D, and a capacitor CP. The light emitting element LM generates light by (e.g., according to) an electrical signal provided from the transistors TFT-S and TFT-D.

The switching transistor TFT-S outputs a data signal applied to the data line DL in response to a scan signal applied to the gate line GL. The capacitor CP charges a voltage corresponding to the data signal received from the switching transistor TFT-S.

The driving transistor TFT-D is connected to the light emitting element LM. The driving transistor TFT-D controls a driving current flowing through the light emitting element LM in correspondence to a charge amount stored in the capacitor CP. The light emitting element LM may emit light during a turn-on period of the driving transistor TFT-D.

The light emitting element LM may receive a first power voltage ELVDD from the power line PL. Also, the light emitting element LM may receive a second power voltage ELVSS.

As illustrated in FIG. 4, a circuit layer CL is disposed on a base film SUB. A semiconductor pattern ALD of the driving transistor TFT-D is disposed on the base film SUB. The semiconductor pattern ALD may include one or more materials selected from amorphous silicon, polysilicon, and a metal oxide semiconductor.

The circuit layer CL may include organic/inorganic layers BR, BF, 12, 14, and 16, the switching transistor TFT-S (e.g., refer to FIG. 3), and the driving transistor TFT-D. The organic/inorganic layers BR, BF, 12, 14, and 16 may include functional layers BR and BF, a first insulation layer 12, a second insulation layer 14, and a third insulation layer 16.

The functional layers BR and BF may be disposed on a surface (e.g., on one surface) of the base film SUB. The functional layers BR and BF may include at least one of a barrier layer BR or a buffer layer BF. The semiconductor pattern ALD may be disposed on the barrier layer BR or the buffer layer BF.

The first insulation layer 12 may be disposed on the base film SUB to cover the semiconductor pattern ALD. The first insulation layer 12 includes an organic layer and/or an inorganic layer. For example, the first insulation layer 12 may include a plurality of inorganic thin-films. The plurality of inorganic thin-films may include a silicon nitride layer and a silicon oxide layer.

A control electrode GED of the driving transistor TFT-D is disposed on the first insulation layer 12. A control electrode of the switching transistor TFT-S (e.g., refer to FIG. 3) may also be disposed on the first insulation layer 12. The control electrode GED may be manufactured (e.g., may be formed) through the same photolithography process as that of the gate line GL (e.g., refer to FIG. 3). In other words, the control electrode GED may be made of the same or substantially the same material as that of the gate line GL, may have the same or substantially the same laminated structure as that of the gate line GL, and may be disposed at (e.g., in or on) the same layer as that of the gate line GL.

The second insulation layer 14 may be disposed on the first insulation layer 12 to cover the control electrode GED. The second insulation layer 14 includes an organic layer and/or an inorganic layer. For example, the second insulation layer 14 may include a plurality of inorganic thin-films. The plurality of inorganic thin-films may include a silicon nitride layer and a silicon oxide layer.

The data line DL (e.g., refer to FIG. 3) may be disposed on the second insulation layer 14. An input electrode SED and an output electrode DED of the driving transistor TFT-D may be disposed on the second insulation layer 14. An input electrode and an output electrode of the switching transistor TFT-S (e.g., refer to FIG. 3) may also be disposed on the second insulation layer 14. The input electrode SED may be branched (e.g., may extend) from a corresponding data line of the data lines DL. The power line PL (e.g., refer to FIG. 3) may be disposed at (e.g., in or on) the same layer as that of the data lines DL. The output electrode DED may be branched (e.g., may extend) from the power line PL.

An electrode of the capacitor CP may be disposed on the second insulation layer 14. The electrode of the capacitor CP may be manufactured (e.g., may be formed) through the same photolithograph process as that of the data lines DL and the power line PL, may be made of the same or substantially the same material as that of the data lines DL and the power line PL, and may be disposed at (e.g., in or on) the same layer as that of the data lines DL and the power line PL.

The input electrode SED and the output electrode DED are connected to the semiconductor pattern ALD through first and second through-holes CH1 and CH2, respectively, passing through (e.g., penetrating through) the first and second insulation layers 12 and 14. In another embodiment of the present disclosure, each of the switching transistor TFT-S and the driving transistor TFT-D may be modified, for example, into a bottom gate structure.

The third insulation layer 16 is disposed on the second insulation layer 14 to cover the input electrode SED and the output electrode DED. The third insulation layer 16 includes an organic layer and/or an inorganic layer. For example, the third insulation layer 16 may include an organic material to provide a flat or substantially flat surface.

One of the first, second, and third insulation layers 12, 14, and 16 may be omitted depending on a circuit structure of the pixel. Each of the second and third insulation layers 14 and 16 may be defined as an interlayer insulation layer. The interlayer insulation layer may be disposed between a conductive pattern disposed below the interlayer insulation layer and a conductive pattern disposed above the interlayer insulation layer to insulate the conductive patterns from each other. An organic light emitting element layer ELL is disposed on the third insulation layer 16. The organic light emitting element layer ELL includes a pixel defining layer (e.g., a pixel defining film) PXL and a light emitting element LM. An anode AE is disposed on the third insulation layer 16. The anode AE is connected to the output electrode DED of the driving transistor TFT-D through a third through-hole CH3 passing through (e.g., penetrating through) the third insulation layer 16. An opening OP is defined in the pixel defining film PXL. The opening OP of the pixel defining film PXL exposes a portion of the anode AE.

The organic light emitting element layer ELL may include a light emitting area PXA, and a non-light emitting area NPXA disposed adjacent to the light emitting area PXA. The non-light emitting area NPXA may surround (e.g., around a periphery of) the light emitting area PXA. In the embodiment of FIG. 4, the light emitting area PXA is defined in correspondence to the anode AE. However, the present disclosure is not limited to the light emitting area PXA shown in FIG. 4. For example, the light emitting area PXA may include various suitable areas for generating light. In some embodiments, the light emitting area PXA may be defined in correspondence to a partial area of the anode AE that is exposed by the opening OP.

A hole control layer HCL may be disposed on the light emitting area PXA and the non-light emitting area NPXA in common. Although not separately shown, a common layer, for example, such as the hole control layer HCL, may be provided to the plurality of pixels PX (e.g., refer to FIG. 3) in common.

A light emitting layer EML is disposed on the hole control layer HCL. The light emitting layer EML may be disposed to correspond to an area of the opening OP. In other words, the light emitting layer EML may be provided in a plurality, and each of the light emitting layers may be provided on a corresponding one of the plurality of pixels PX.

The light emitting layer EML may contain an organic material or an inorganic material.

An electron control layer ECL is disposed on the light emitting layer EML. A cathode CE is disposed on the electronic control layer ECL. The cathode CE may be disposed on the plurality of pixels PX in common.

Although the patterned light emitting layer EML is illustrated in the embodiment of FIG. 4 as an example, the present disclosure is not limited thereto, and the light emitting layer EML may be disposed on the plurality of pixels PX in common. In this case, the light emitting layer EML may generate white light. Further, in some embodiments, the light emitting layer EML may have a multilayered structure.

In the embodiment of FIG. 4, the thin-film encapsulation layer TFE directly covers the cathode CE. However, the present disclosure is not limited thereto, and in another embodiment, a capping layer for covering the cathode CE may be further disposed. In this case, the thin-film encapsulation layer TFE may directly cover the capping layer. The thin-film encapsulation layer TFE may include an organic layer containing an organic material, and an inorganic layer containing an inorganic material.

Figure 5:
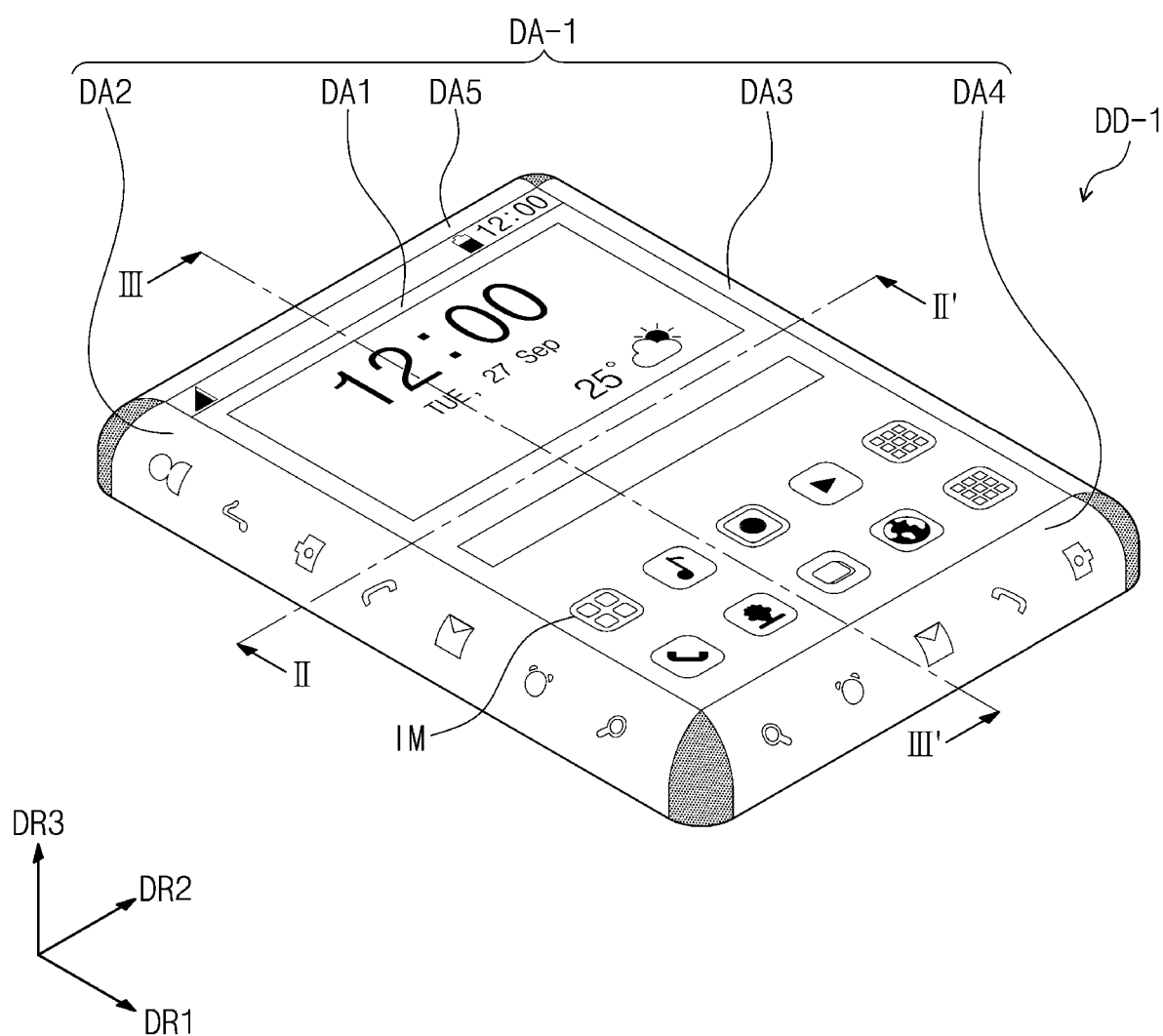
FIG. 5 is a perspective view of a display device according to an embodiment of the present disclosure.

FIG. 5 is a perspective view of a display device DD-1 according to an embodiment of the present disclosure.

As illustrated in FIG. 5, a display area DA-1 may be defined on the display device DD-1.

The display area DA-1 includes a first display area DA1 for displaying an image IM through a front surface, and second to fifth display areas DA2 to DA5 each for displaying the image IM through a corresponding side surface. FIG. 5 illustrates icon images IM as an example of the image IM.

As illustrated in FIG. 5, the display device DD-1 may be a four side surface bended display device including four side display areas DA2 to DA5. However, the present disclosure is not limited thereto.

Figure 6:
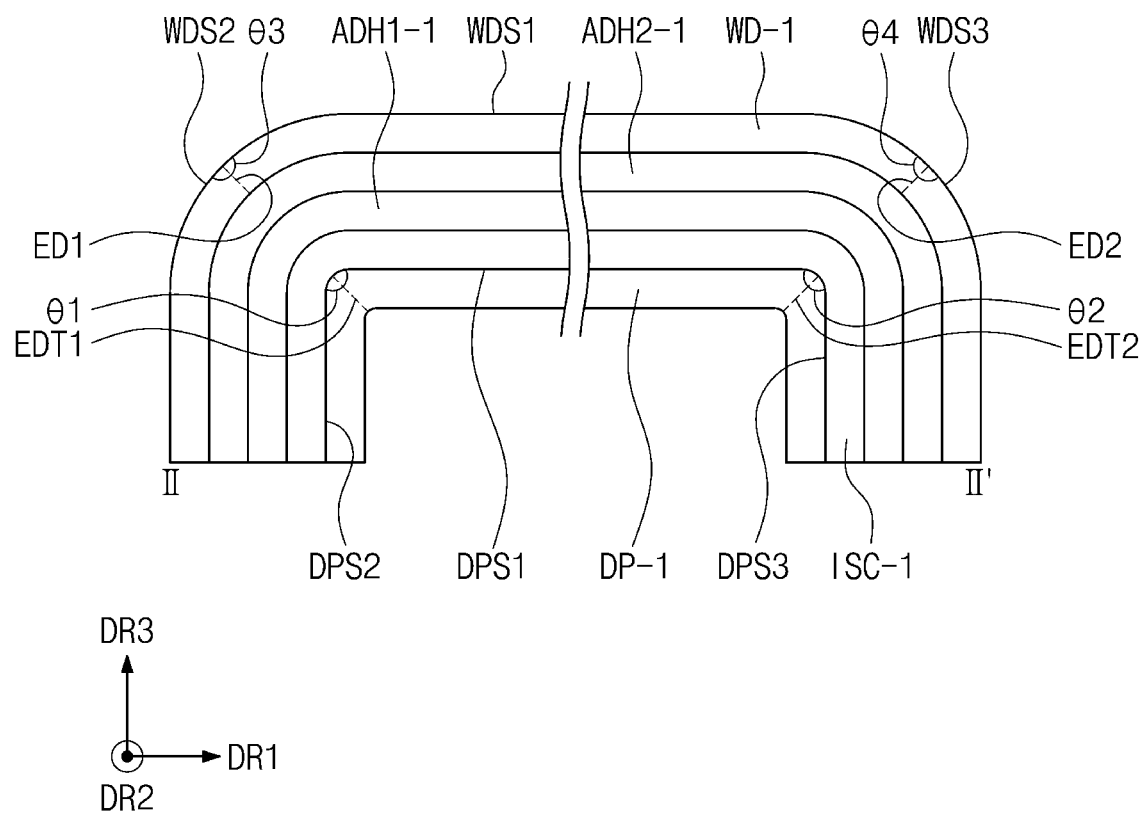
FIG. 6 is a view illustrating a portion of a cross-section taken along the line II-II' of FIG. 5.
Figure 7:
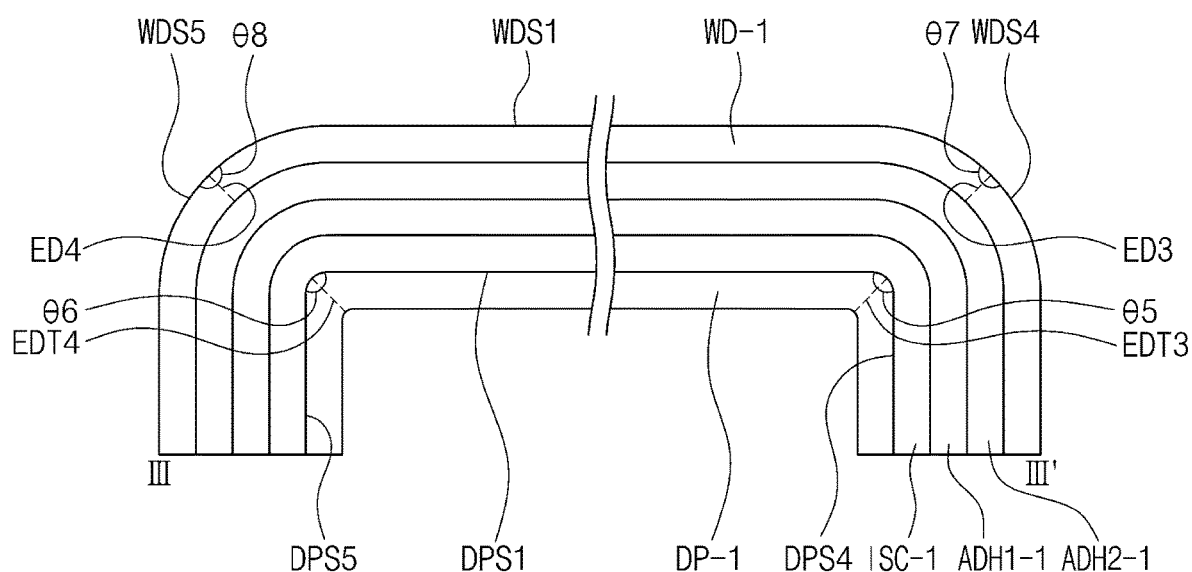
FIG. 7 is a view illustrating a portion of a cross-section taken along the line of FIG. 5.

FIG. 6 is a view illustrating a portion of a cross-section taken along the line II-II' of FIG. 5. FIG. 7 is a view illustrating a portion of a cross-section taken along the line of FIG. 5.

Referring to FIGS. 6 and 7, the display device DD-1 according to an embodiment of present disclosure may include a display panel DP-1, an input sensing circuit ISC-1, a first adhesive member (e.g., a first adhesive layer) ADH1-1, a second adhesive member (e.g., a second adhesive layer) ADH2-1, and a window member (e.g., a window layer) WD-1.

Referring to FIGS. 6 and 7, the display panel DP-1 may include first to fifth display surfaces DPS1 to DPS5.

For example, the first to fifth display areas DA1 to DA5 in FIG. 5 may correspond to the first to fifth display surfaces DPS1 to DPS5 in FIGS. 6 and 7, respectively.

Because the elements shown in FIG. 6 are the same or substantially the same as those of FIG. 2, redundant description of the elements shown in FIG. 6 may not be repeated.

Referring to FIG. 7, the fourth display surface DPS4 may extend from a third side EDT3 of the first display surface DPS1, and may provide an angle (e.g., a predetermined angle) (θ5) with respect to the first display surface DPS1.

The fifth display surface DPS5 may extend from a fourth side EDT4 of the first display surface DPS1, and may provide an angle (e.g., a predetermined angle) (86) with respect to the first display surface DPS1.

At least a portion of each of the fourth display surface DPS4 and the fifth display surface DPS5 may have a suitable curvature (e.g., a predetermined curvature).

The angle (θ5) provided between the first display surface DPS1 and the fourth display surface DPS4 and/or the angle (θ6) provided between the first display surface DPS1 and the fifth display surface DPS5 may be greater than or equal to about 90° and less than about 180°.

Referring to FIGS. 6 and 7, the window member WD-1 may include first to fifth transmission surfaces WDS1 to WDS5.

The fourth transmission surface WDS4 may extend from a third transmission side ED3 of the first transmission surface WDS1, and may provide an angle (e.g., a predetermined angle) (θ7) with respect to the first transmission surface WDS1.

The fifth transmission surface WDS5 may extend from a fourth transmission side ED4 of the first transmission surface WDS1, and may provide an angle (e.g., a predetermined angle) (θ8) with respect to the first transmission surface WDS1.

At least a portion of each of the fourth transmission surface WDS4 and the fifth transmission surface WDS5 may have a suitable curvature (e.g., a predetermined curvature).

The angle (θ7) provided between the first transmission surface WDS1 and the fourth transmission surface WDS4 and/or the angle (θ8) provided between the first transmission surface WDS1 and the fifth transmission surface WDS5 may be greater than or equal to about 90° and less than or equal to about 180°.

Figure 8:
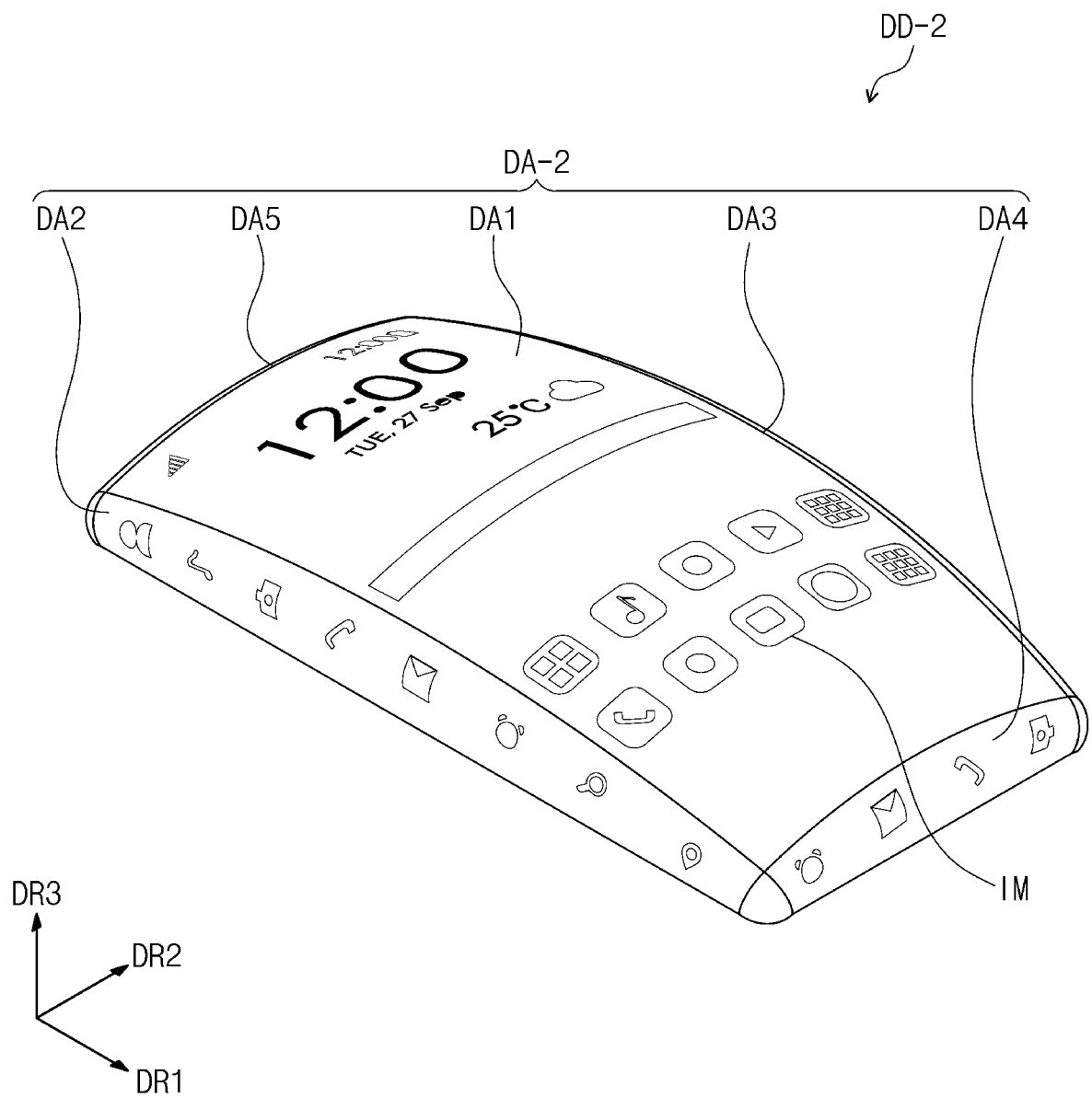
FIG. 8 is a perspective view of a display device according to an embodiment of the present disclosure.

FIG. 8 is a perspective view of a display device DD-2 according to an embodiment of the present disclosure.

In FIG. 8, a display area DA-2 may be defined on the display device DD-2. The display area DA-2 may include first to fifth display areas DA1 to DA5.

The first display area DA1 may have a convex curved shape that is curved with a suitable curvature (e.g., a predetermined curvature). In other words, the display device DD-2 may be an all-around display device in which the entire display area DA-2 has a curved surface.

Figure 10A:
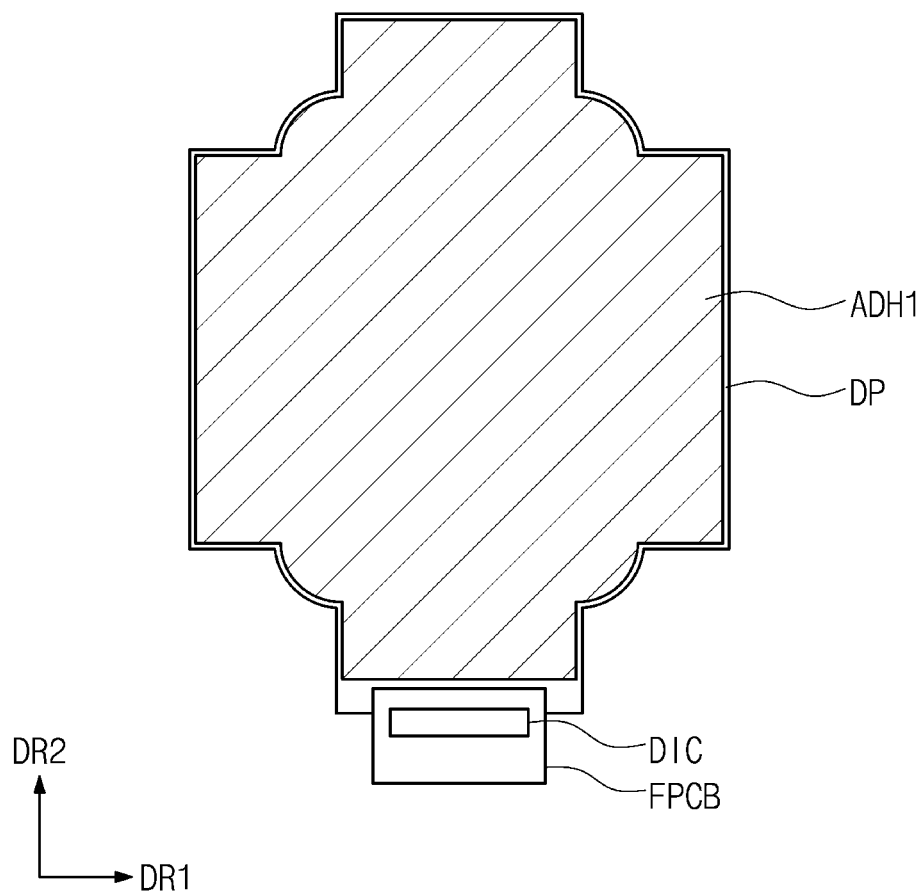
FIG. 10A is a perspective view illustrating a state in which a first adhesive member is disposed on a display panel according to an embodiment of the present disclosure.
Figure 10B:
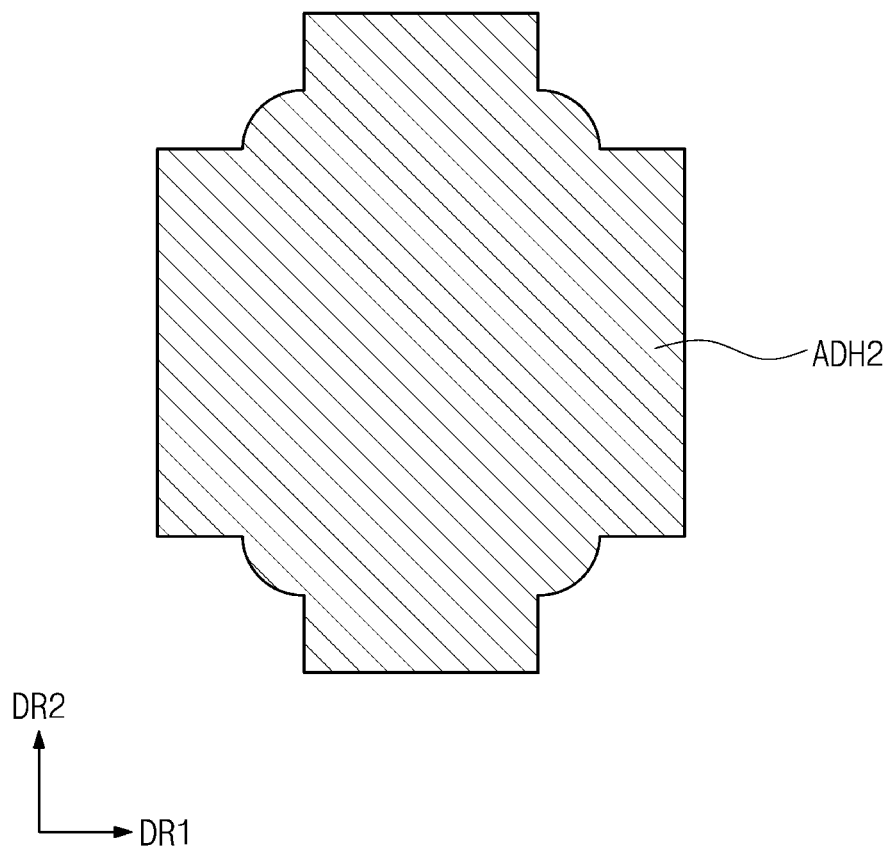
FIG. 10B is a perspective view of a second adhesive member according to an embodiment of the present disclosure.
Figure 10C:
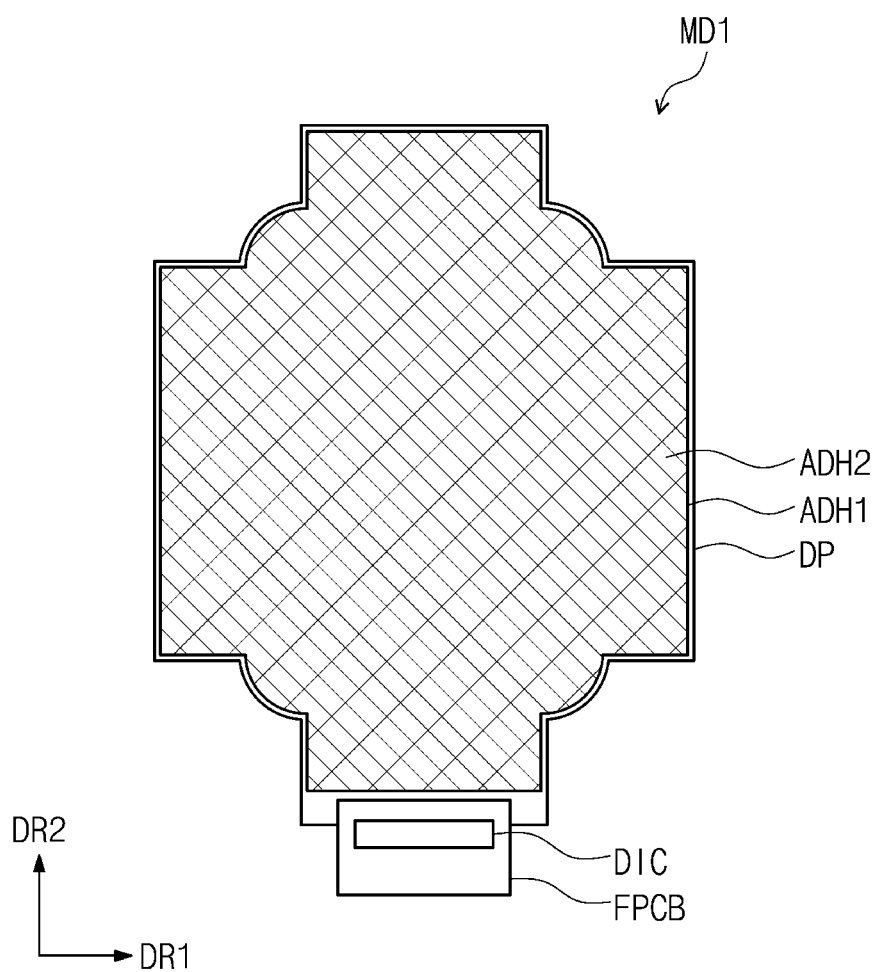
FIG. 10C is a perspective view of a first module according to an embodiment of the present disclosure.

FIG. 9 is a flowchart representing a method S10 for manufacturing a display device according to an embodiment of the present disclosure. FIG. 10A is a perspective view illustrating an example of a state in which a first adhesive member ADH1 is disposed on a display panel DP. FIG. 10B is a perspective view of a second adhesive member ADH2 according to an embodiment of the present disclosure. FIG. 10C is a perspective view of a first module MD1 according to an embodiment of the present disclosure.

The method S10 for manufacturing the display device may include: a process (e.g., an optical clear adhesive disposing process) S100 of disposing an optical clear adhesive; a process (e.g., a first module generating process) S200 of generating a first module; a process (e.g., a second module generating process) S300 of generating a second module; a process (e.g., an alignment process) S400 of aligning; a process (e.g., a close contact process) S500 of closely contacting; a process (e.g., a third module generating process) S600 of generating a third module; and a process (e.g., a separation process) S700 of separating. FIGS. 10A to 10C are views illustrating the process S100 of disposing the optical clear adhesive, and the process S200 of generating the first module.

Referring to FIGS. 9 and 10A, the first adhesive member ADH1 is disposed on the display panel DP in the process S100 of disposing the optical clear adhesive.

Referring to FIGS. 9, 10B, and 10C, the second adhesive member ADH2 is disposed on the first adhesive member ADH1 as shown in FIG. 10B to form the first module MD1 shown in FIG. 10C in the process S200 of generating the first module MD1. In this case, the second adhesive member ADH2 may be directly disposed on the first adhesive member ADH1.

The first module MD1 includes the display panel DP, the first adhesive member ADH1 disposed on the display panel DP, and the second adhesive member ADH2 disposed on the first adhesive member ADH1. Because the display panel DP, the first adhesive member ADH1, and the second adhesive member ADH2 may be applied in the same or substantially the same manner as those of one or more example embodiments described above, hereinafter, features that are different from the above-described features may be mainly described.

The display panel DP may include a plurality of pads for providing electrical signals applied from the outside to a plurality of organic light emitting elements LM (e.g., refer to FIG. 3).

Referring to FIGS. 10A and 10C, the plurality of pads may be connected to a flexible circuit board FPCB that is disposed at a lower portion of the display panel DP. The flexible circuit board FPCB may transmit electrical signals provided from a driver driving chip (DIC) to the display panel DP through the plurality of pads.

Figure 11:
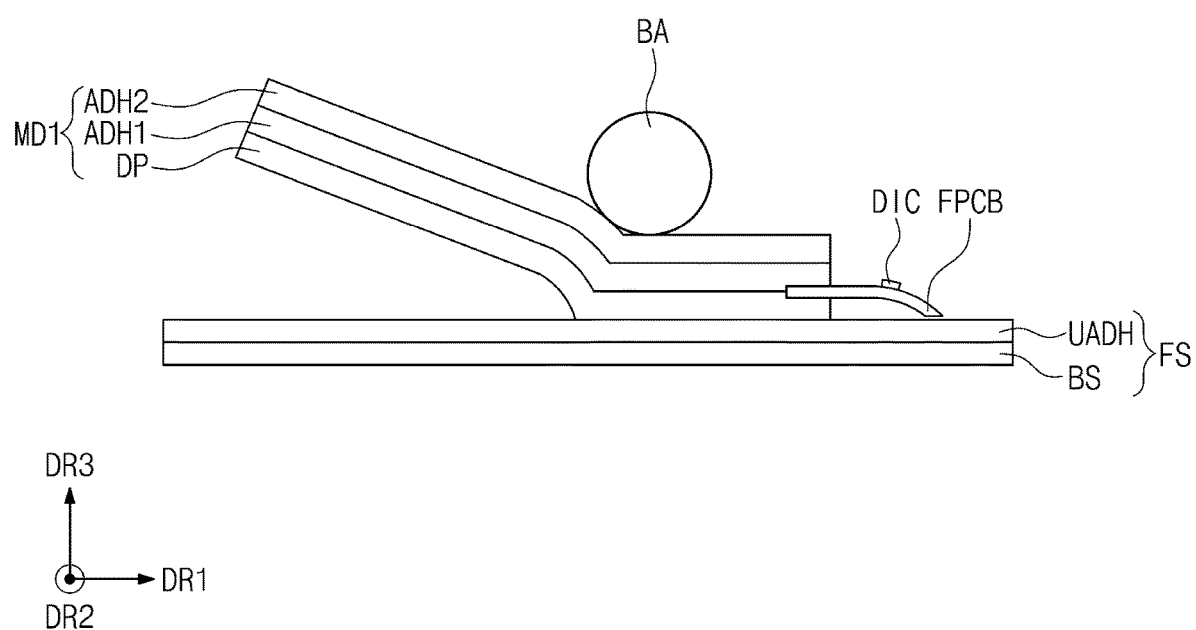
FIG. 11 is a cross-sectional view illustrating a process of generating a second module according to an embodiment of present disclosure.

FIG. 11 is a cross-sectional view illustrating the process S300 of generating the second module MD2 according to an embodiment of present disclosure.

Figure 12:
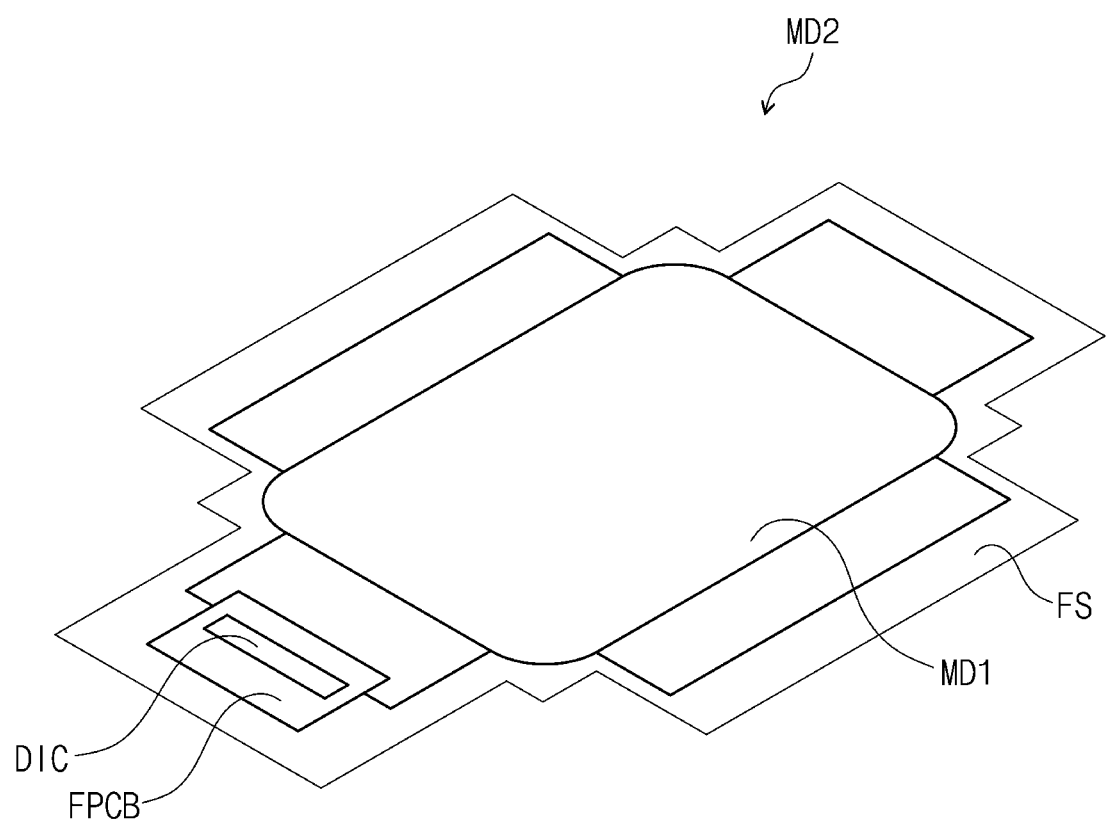
FIG. 12 is a perspective view of the second module according to an embodiment of the present disclosure.

FIG. 12 is a perspective view of the second module MD2 according to an embodiment of present disclosure.

Referring to FIGS. 9 and 11, the first module MD1 is disposed on a fixing sheet FS in the process S300 of generating the second module. Referring to FIG. 11, a roller BA presses the first module MD1 onto the fixing sheet FS while moving in a direction parallel to or substantially parallel to the first direction DR1, and thus, the first module MD1 is attached onto the fixing sheet FS to generate the second module MD2. Accordingly, in some embodiments, the second module MD2 may include the first module MD1 (e.g., including the display panel DP, the first adhesive member ADH1, and the second adhesive member ADH2) and the fixing sheet FS.

The fixing sheet FS may be an ultraviolet adhesive sheet. The fixing sheet FS may include a base sheet BS, and an ultraviolet curing resin UADH disposed on the base sheet BS in a non-cured state.

When the ultraviolet adhesive sheet is used as the fixing sheet FS, the base sheet BS may adopt (e.g., may include) one or more general materials known to those having ordinary skill in the art without any particular limitations. For example, the base sheet BS may be made of Poly Ethylene Terephthalate (PET). However, the present disclosure is not limited thereto.

When the ultraviolet adhesive sheet is used as the fixing sheet FS, the ultraviolet curing resin UADH may include one or more general ultraviolet curing resins known to those having ordinary skill in the art without any particular limitations. For example, the ultraviolet curing resin UADH may include an acrylic-based material, and may further include an isocyanate-based material. The ultraviolet curing resin UADH has an adhesive property in a non-cured state, but may lose the adhesive property when cured by receiving ultraviolet light.

For example, when the ultraviolet adhesive sheet is used as the fixing sheet FS, the first module MD1 is disposed on the ultraviolet curing resin UADH by the roller. Because the non-cured ultraviolet curing resin UADH has the adhesive property, the first module MD1 is attached to the ultraviolet adhesive sheet. However, the present disclosure is not limited thereto.

Because the fixing sheet FS is attached with the first module MD1, a process on the first module MD1 may be performed (e.g., may be easily performed) by fixing the fixing sheet FS in a following process.

Figure 13A:
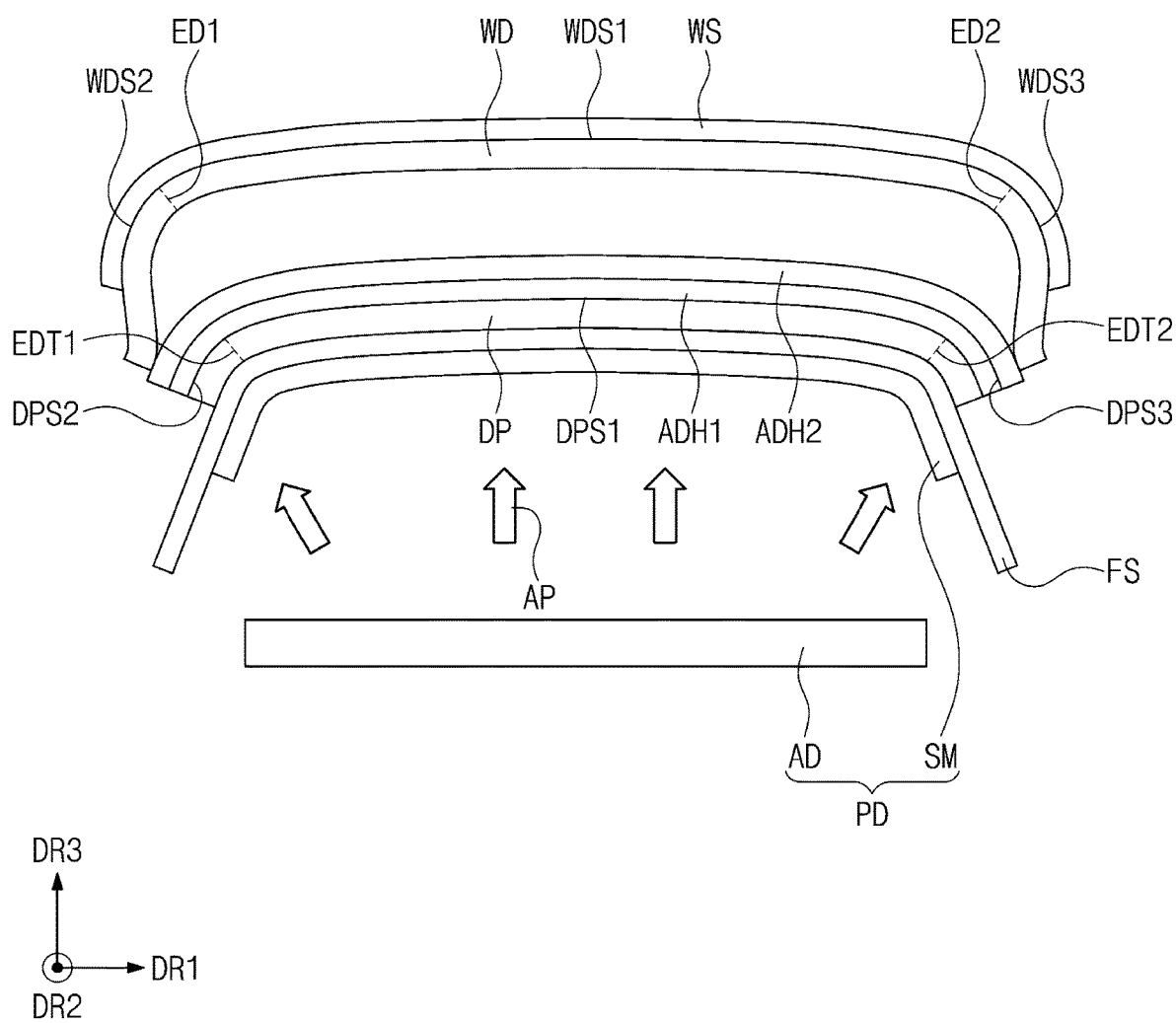
FIG. 13A is a view illustrating an alignment process of FIG. 9.

FIG. 13A is a view illustrating the alignment process S400 of FIG. 9.

Referring to FIGS. 9 and 13A, a window member WD is aligned on the second module MD2 in the alignment process S400.

Because the above-described features of the window member WD may be applied in the same or substantially the same manner, hereinafter, features that are different from those described above may be mainly described.

The alignment process S400 may include a process of fixing the window member WD. Because the window member WD is fixed, a defect caused by shaking of the window member WD during a process may be prevented or substantially prevented from occurring. For example, the window member WD may be fixed to a window stage WS. However, the present disclosure is not limited thereto. For example, the window member WD may be fixed by using well-known methods to those having ordinary skill in the art.

The alignment process S400 may include a process of disposing the second module MD2 on a pressure applying device PD. The pressure applying device may include a stretchable membrane SM, and a pneumatic pressure supplying device AD.

Figure 13B:
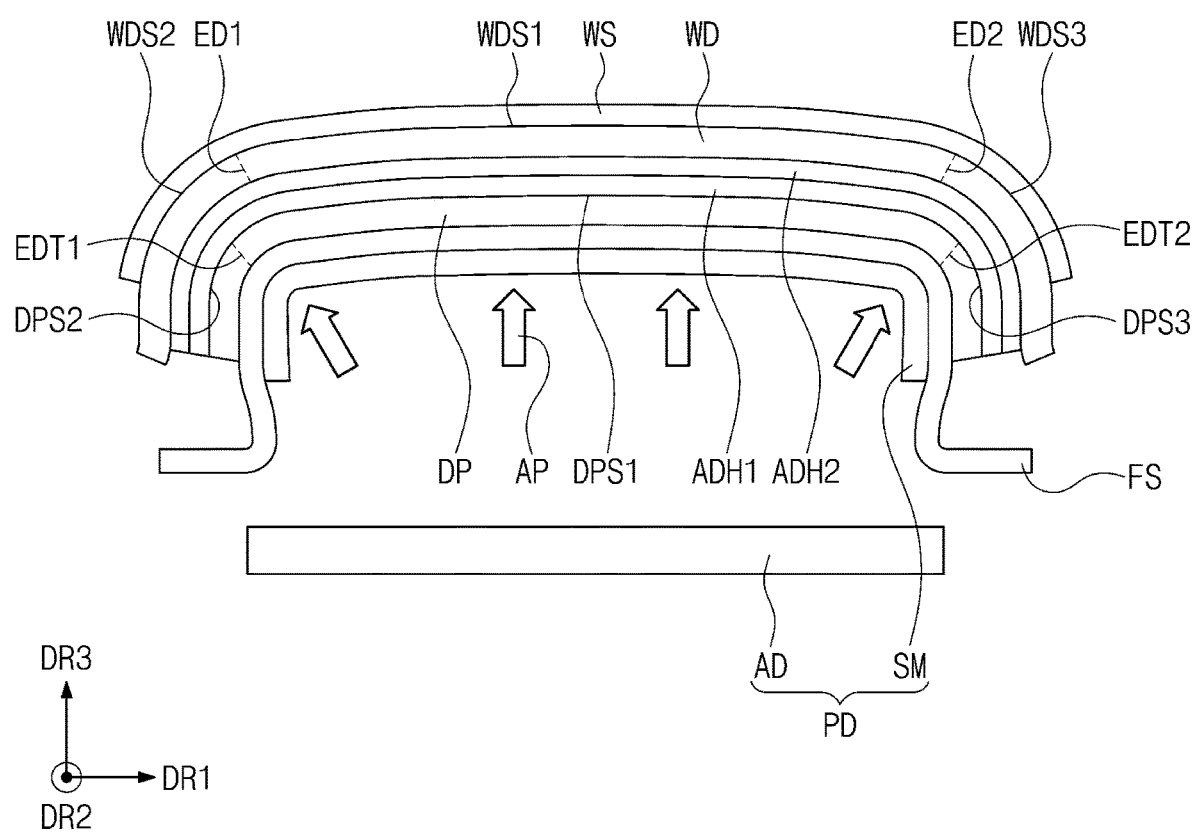
FIG. 13B is a view illustrating a close contact process of FIG. 9.

FIG. 13B is a view illustrating the close contact process S500 of FIG. 9.

Referring to FIGS. 9 and 13B, a pressure is applied from below the second module MD2, and thus, the second module MD2 closely contacts the window member WD in the close contact process S500.

The close contact process S500 may include a process of allowing the second module MD2 and the window member WD to closely contact each other by applying a pneumatic pressure AP to the stretchable membrane SM by the pneumatic pressure supplying device AD. However, the present disclosure is not limited thereto. For example, the second module MD2 and the window member WD may be aligned and may closely contact each other by using well-known methods to those having ordinary skill in the art.

When the second adhesive member ADH2 is not provided, opposite side portions (e.g., both side portions) of the first adhesive member ADH1 may closely contact opposite side portions (e.g., both side portions) of the window member WD in advance, before a central portion of the first adhesive member ADH1 closely contacts a central portion of the window member WD. In this case, because the first adhesive member ADH1 has an adhesive force in a room temperature state, a stress may be applied to a portion between the first adhesive member ADH1 and the window member WD to generate a crack and/or damage in a portion of the components constituting the display device.

Thus, when the second adhesive member ADH2 having no adhesive force at a room temperature is used as in one or more embodiments of the present disclosure, the crack and/or damage may not be generated or may be reduced. In other words, according to one or more example embodiments of the present disclosure, even when the side portion of the second adhesive member ADH2 firstly contacts the side portion of the window member WD, because the second adhesive member ADH2 has no adhesive force in the room temperature state, a crack generated as a stress that may be concentrated on a side portion of the second module MD2 may be prevented or reduced in the close contact process S500.

The central portion of the window member WD may represent the first transmission surface WDS1, and the side portions of the window member WD may represent the second transmission surface WDS2 and the third transmission surface WDS3.

Figure 13C:
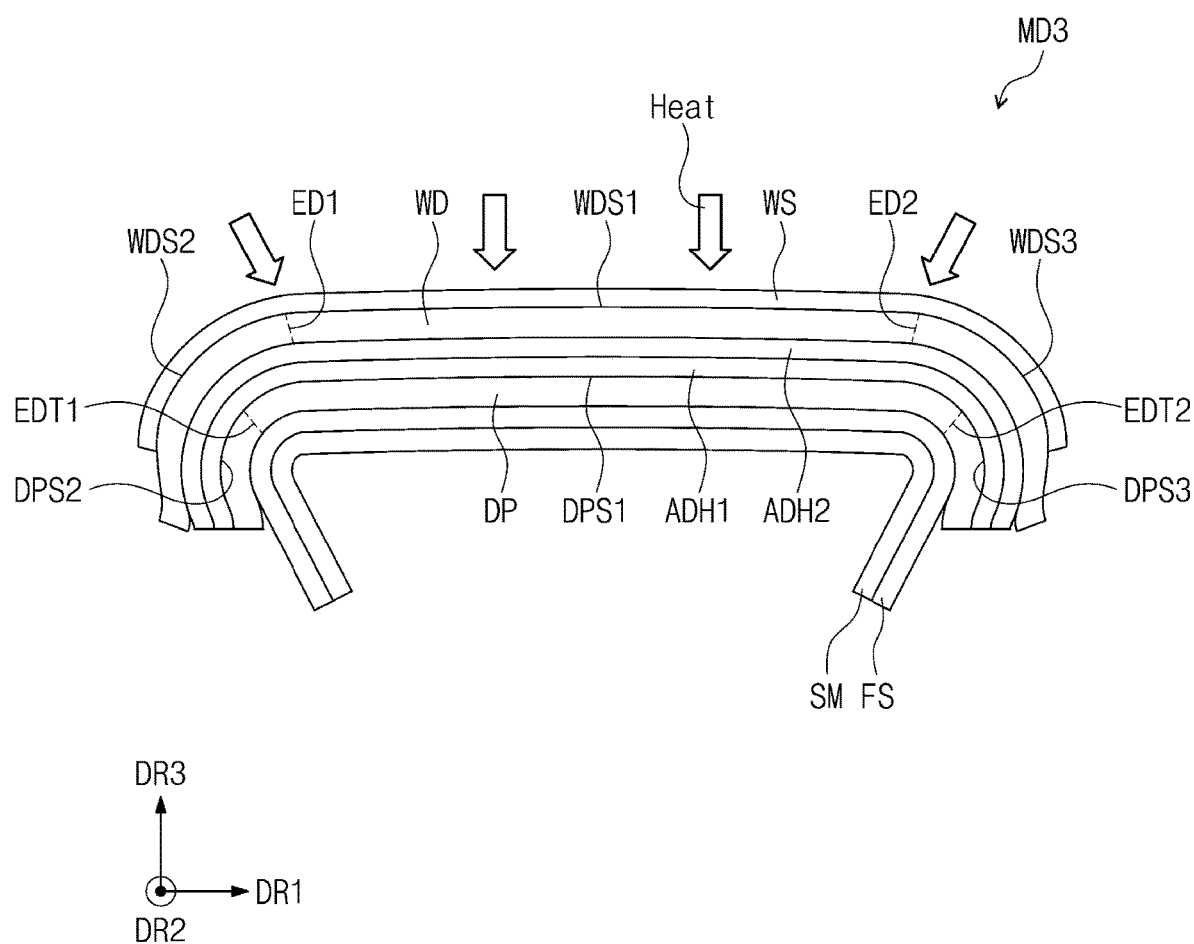
FIG. 13C is a view illustrating a third module generating process of FIG. 9.

FIG. 13C is a view illustrating the third module generating process S600 of FIG. 9.

Referring to FIGS. 9 and 13C, in the third module generating process S600, as heat (e.g., a predetermined heat) is applied onto the window member WD for a suitable time or duration (e.g., for a predetermined time), the window member WD is connected with the second module MD2 to generate a third module MD3. Accordingly, in some embodiments, the third module MD3 may include the second module MD2 (e.g., including the first module MD1 and the fixing sheet FS) and the window member WD.

When the heat is applied for the suitable time, the solid second adhesive member ADH2 is liquefied, and the liquefied second adhesive member ADH2 is applied and pressed to the second module MD2 and the window member WD. The liquefied second adhesive member ADH2 attaches the second module MD2 with the window member WD while being cooled and solidified again, to thereby generate the third module MD3.

The heat may be greater than or equal to about 70° C. and less than or equal to about 100° C. The suitable time may be greater than or equal to about 15 minutes and less than or equal to about 25 minutes. In some embodiments, heat having a temperature greater than or equal to about 75° C. and less than or equal to about 80° C. may be applied for about 20 minutes. When heat having a temperature greater than about 100° C. is applied, an organic material of an organic light emitting element layer ELL may be deformed or thermally deteriorated, and when heat having a temperature less than about 70° C. is applied, the second adhesive member ADH2 may not be sufficiently liquefied, and thus, the adhesive force thereof may be reduced. When heat is applied for a time greater than about 25 minutes, the liquefied second adhesive member ADH2 may flow to cause a defect, and a process time may be increased. When heat is applied for a time less than about 15 minutes, the second adhesive member ADH2 may not be sufficiently liquefied, and thus, the adhesive force thereof may be reduced.

Figure 13D:
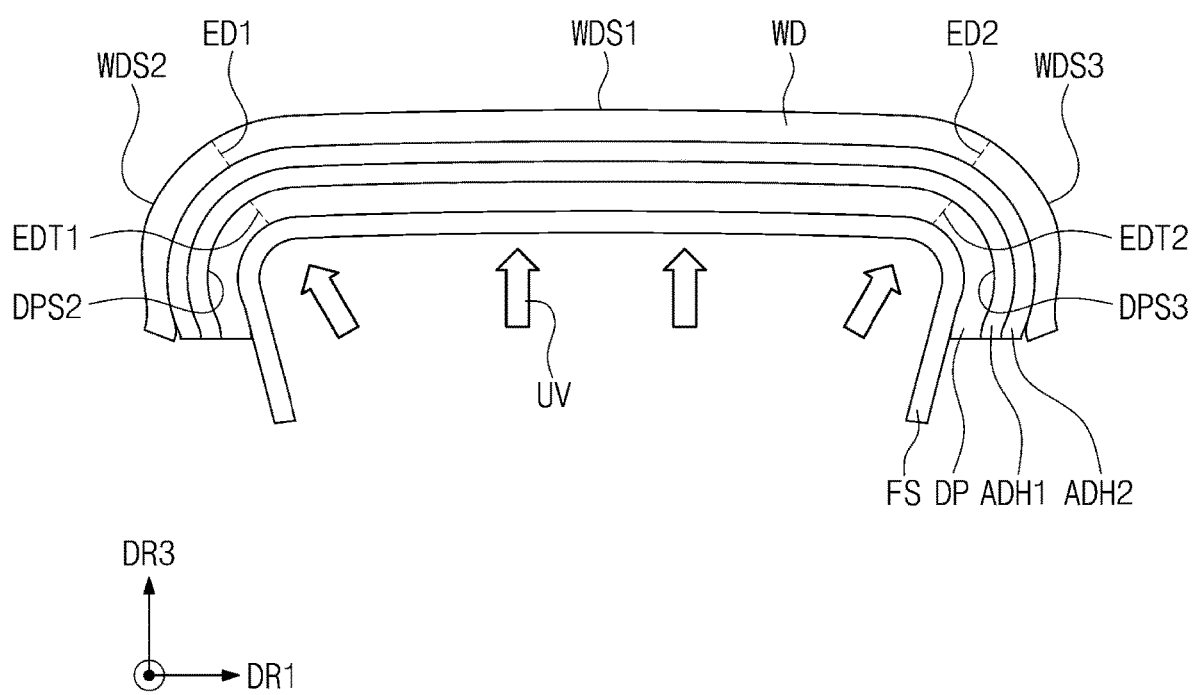

FIGS. 13D and 13E are views illustrating the separation process S700 of FIG. 9.

Referring to FIGS. 9, 13D, and 13E, the fixing sheet FS may be separated from the display panel DP in the separation process S700.

As illustrated in FIG. 13D, when the ultraviolet adhesive sheet is used as the fixing sheet FS, the separation process S700 may include a process of applying UV light to a lower portion of the fixing sheet FS. When the UV light is applied to the lower portion of the fixing sheet FS, as the ultraviolet curing resin UADH is cured, the fixing sheet FS may lose an adhesive property, and thus, may be separated (e.g., may be easily separated) from the display panel DP as illustrated in FIG. 13E.

In the process of applying the UV light, the UV light may have a wavelength greater than or equal to about 330 nm and less than or equal to about 390 nm. For example, in some embodiments, the UV light may have a wavelength of about 365 nm. However, the present disclosure is not limited thereto.

Although FIGS. 10A to 13E are described with respect to the four side surface bended display device DD-1 as illustrated in FIG. 5, the above-described method for manufacturing the display device may applied in the same or substantially the same manner to a method for manufacturing the two surface bended display device DD in FIG. 1, and the method for manufacturing the all-around display device DD-2 in FIG. 8.

According to one or more example embodiments of the present disclosure, damage that may be caused to the display device when the window member and the display module are attached to each other may be prevented or substantially prevented.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

The invention claimed is:

1. A method for manufacturing a display device, comprising:
    disposing an optical clear adhesive (OCA) comprising an acrylic-based material on a display module, the display module comprising a flexible display panel, and an input sensing circuit on the flexible display panel;
    generating a first module by disposing a hot-melt adhesive on the optical clear adhesive, the hot-melt adhesive comprising at least one of a polyurethane-based material, a polyethersulfone-based material, a polyamide-based material, or an ethylene-vinyl acetate-based material;

generating a second module by pressing the first module on a fixing sheet with a roller disposed directly on the hot-melt adhesive, the roller moving in a direction perpendicular to a stacking direction of the first module and the fixing sheet;

aligning a window member on the second module, the window member comprising a first transmission surface having a first side and a second side opposite the first side, a second transmission surface extending from the first side at an angle with respect to the first transmission surface, and a third transmission surface extending from the second side at an angle with respect to the first transmission surface;

contacting the second module and the window member to each other;

generating a third module by coupling the second module and the window member to each other by applying heat to the second module and the window member for a time; and separating the fixing sheet from the third module, wherein an adhesive force of the hot-melt adhesive in the contacting of the second module and the window member to each other is less than the adhesive force of the hot-melt adhesive in the generating of the third module.

2. The method of claim 1, wherein at least a portion of each of the second transmission surface and the third transmission surface has a curvature.

3. The method of claim 1, wherein the angle between the first transmission surface and the second transmission surface is greater than or equal to 90° and less than or equal to 180°, and the angle between the first transmission surface and the third transmission surface is greater than or equal to 90° and less than or equal to 180°.

4. The method of claim 1, wherein:
the first transmission surface further comprises:
a third side configured to form an angle with each of the first side and the second side; and
a fourth side opposite the third side; and
the window member further comprises:
a fourth transmission surface extending from the third side at an angle with respect to the first transmission surface; and
a fifth transmission surface extending from the fourth side at an angle with respect to the first transmission surface.

5. The method of claim 1, wherein the first transmission surface has a convex curved shape.

6. The method of claim 1, wherein the heat is greater than or equal to 70° Celsius and less than or equal to 100° Celsius, and the time is greater than or equal to 15 minutes and less than or equal to 25 minutes.

7. The method of claim 1, wherein:
the aligning of the window member on the second module comprises disposing the second module on a pressure applying device comprising a stretchable membrane and a pneumatic pressure supplying device; and
the contacting of the second module and the window member to each other comprises applying a pneumatic pressure to the stretchable membrane by the pneumatic pressure supplying device to allow the second module and the window member to closely contact each other.

8. The method of claim 1, wherein the fixing sheet comprises:
a protection film; and
a non-cured ultraviolet curing resin that is disposed on one surface of the protection film in the generating of the second module, and
wherein the separating of the fixing sheet from the third module comprises curing the non-cured ultraviolet curing resin by supplying UV light to the fixing sheet.

9. The method of claim 8, wherein the UV light has a wavelength greater than or equal to 330 nm and less than or equal to 390 nm.

10. The method of claim 1, wherein the flexible display panel comprises an organic light emitting element.

11. The method of claim 1, wherein the flexible display panel comprises:
a base film;
a circuit layer on the base film;
an organic light emitting element layer on the circuit layer; and
a thin-film encapsulation layer configured to seal the organic light emitting element layer, and
wherein the input sensing circuit is directly on the thin-film encapsulation layer.

* * * * *